US010312420B2

(12) United States Patent
Lee et al.

(10) Patent No.: US 10,312,420 B2
(45) Date of Patent: Jun. 4, 2019

(54) LIGHT-EMITTING DEVICE HAVING SURFACE-MODIFIED LUMINOPHORES

(71) Applicants: Seoul Semiconductor Co., Ltd., Ansan-si (KR); LITEC-LP GmbH, Greifswald (DE)

(72) Inventors: Chung Hoon Lee, Ansan-si (KR); Walter Tews, Greifswald (DE); Gundula Roth, Levenhagen (DE); Detlef Starick, Greifswald (DE)

(73) Assignees: Seoul Semiconducter Co., Ltd., Ansan-si (KR); LITEC-LP Gmbh, Greifswald (DE)

( * ) Notice: Subject to any disclaimer, the term of this patent is extended or adjusted under 35 U.S.C. 154(b) by 0 days.

(21) Appl. No.: 15/940,926

(22) Filed: Mar. 29, 2018

(65) Prior Publication Data

US 2018/0219141 A1 Aug. 2, 2018

Related U.S. Application Data

(63) Continuation of application No. 15/434,903, filed on Feb. 16, 2017, now Pat. No. 9,960,324, which is a
(Continued)

(30) Foreign Application Priority Data

Aug. 14, 2010 (DE) .................. 10 2010 034 322
Dec. 28, 2010 (KR) .................. 10-2010-0137026

(51) Int. Cl.
*H01L 33/50* (2010.01)
*H01L 33/62* (2010.01)
(Continued)

(52) U.S. Cl.
CPC .......... *H01L 33/504* (2013.01); *C09K 11/025* (2013.01); *C09K 11/7734* (2013.01);
(Continued)

(58) Field of Classification Search
None
See application file for complete search history.

(56) References Cited

U.S. PATENT DOCUMENTS 5,792,509 A   8/1998   Lin et al.
6,489,716 B1  12/2002  Tews et al.
(Continued)

FOREIGN PATENT DOCUMENTS

CN   10-1072844   11/2007
CN   101586025    11/2009
(Continued)

OTHER PUBLICATIONS

Hollemann et al., "Lehrbuch der Anorganischen Chemie" Inorganic Chemistry; 102 edition, (Walter de Gruyeter & Co., Berlin, 2007). pp. 954-985.
(Continued)

*Primary Examiner* — Benjamin P Sandvik
(74) *Attorney, Agent, or Firm* — H.C. Park & Associates, PLC

(57) ABSTRACT

A light emitting device including a housing, a plurality of heat-sinks adjoined to the housing and insulated from each other, a bottom surface of the heat-sinks being exposed to the outside, a light emitting diode mounted on at least one of the heat-sinks via a conductive adhesive, and a molding member encapsulating the light emitting diode and including thermosetting resin, in which a fluoride luminophore including I and IV group elements with fluorine and other luminophore are dispersed in the molding member, and the luminophores are configured to absorb at least a portion of light emitted from the light emitting diode and emit light having a wavelength different from that of the absorbed light.

9 Claims, 12 Drawing Sheets

Related U.S. Application Data continuation of application No. 14/858,641, filed on Sep. 18, 2015, now Pat. No. 9,614,129, which is a continuation-in-part of application No. 14/076,642, filed on Nov. 11, 2013, now Pat. No. 9,196,785, which is a continuation-in-part of application No. 13/209,733, filed on Aug. 15, 2011, now Pat. No. 8,581,286.

(51) Int. Cl.

| | | |
|---|---|---|
| C09K 11/02 | (2006.01) | |
| C09K 11/77 | (2006.01) | |
| H01L 33/52 | (2010.01) | |
| H01L 23/00 | (2006.01) | |

(52) U.S. Cl.
CPC .......... *H01L 33/502* (2013.01); *H01L 33/507* (2013.01); *H01L 33/52* (2013.01); *H01L 33/62* (2013.01); *H01L 24/32* (2013.01); *H01L 24/48* (2013.01); *H01L 24/73* (2013.01); *H01L 33/501* (2013.01); *H01L 2224/32013* (2013.01); *H01L 2224/32245* (2013.01); *H01L 2224/32257* (2013.01); *H01L 2224/48091* (2013.01); *H01L 2224/48247* (2013.01); *H01L 2224/73265* (2013.01); *H01L 2224/8592* (2013.01); *H01L 2924/00014* (2013.01); *H01L 2924/12041* (2013.01); *H01L 2924/181* (2013.01); *H01L 2924/19107* (2013.01)

(56) References Cited

U.S. PATENT DOCUMENTS

| | | | |
|---|---|---|---|
| 7,161,298 | B2 | 1/2007 | Kawamura et al. |
| 7,629,620 | B2 | 12/2009 | Maeda et al. |
| 7,922,937 | B2 | 4/2011 | Li et al. |
| 8,581,286 | B2 | 11/2013 | Lee et al. |
| 8,734,762 | B2 | 5/2014 | Chung et al. |
| 9,614,129 | B2 * | 4/2017 | Lee .................... H01L 33/52 |
| 9,960,324 | B2 * | 5/2018 | Lee .................... H01L 33/502 |
| 2003/0173540 | A1 | 9/2003 | Bradford et al. |
| 2004/0239247 | A1 | 12/2004 | Hiroyuki et al. |
| 2005/0227077 | A1 | 10/2005 | Sugiyarna |
| 2007/0001585 | A1 | 1/2007 | Kazuhiro et al. |
| 2007/0125984 | A1 | 6/2007 | Tian et al. |
| 2007/0232181 | A1 | 10/2007 | Okumura et al. |
| 2008/0023721 | A1 | 1/2008 | Lee et al. |
| 2008/0135862 | A1 | 6/2008 | Maeda et al. |
| 2008/0174233 | A1 | 7/2008 | Bawendi et al. |
| 2009/0134413 | A1 * | 5/2009 | Roth ................... C09K 11/663 |
| | | | 257/98 |
| 2009/0134414 | A1 | 5/2009 | Li et al. |
| 2009/0134775 | A1 | 5/2009 | Watanabe et al. |
| 2009/0218581 | A1 | 9/2009 | Schmidt et al. |
| 2009/0289546 | A1 | 11/2009 | Igarashi et al. |
| 2010/0091215 | A1 * | 4/2010 | Fukunaga ............ C09K 11/664 |
| | | | 349/61 |
| 2010/0142189 | A1 | 6/2010 | Hong et al. |
| 2010/0207132 | A1 | 8/2010 | Lee et al. |
| 2012/0037850 | A1 | 2/2012 | Lee et al. |
| 2012/0193579 | A1 | 8/2012 | Kempfert et al. |
| 2012/0299032 | A1 | 11/2012 | Li |

FOREIGN PATENT DOCUMENTS

| | | |
|---|---|---|
| EP | 550937 | 1/1992 |
| EP | 877070 | 11/1998 |
| EP | 1124913 | 9/2008 |
| EP | 2396385 | 12/2011 |
| EP | 2554628 | 2/2013 |
| JP | 52-22584 | 2/1977 |
| JP | 52-156188 | 12/1977 |
| JP | 10-125240 | 5/1998 |
| JP | H10-125240 | 5/1998 |
| JP | 2002-069442 | 3/2002 |
| JP | 2002-329895 | 11/2002 |
| JP | 2003-041247 | 2/2003 |
| JP | 2004-143408 | 5/2004 |
| JP | 2005-003436 | 1/2005 |
| JP | 2005-068343 | 3/2005 |
| JP | 2005-187797 | 7/2005 |
| JP | 2006-036943 | 2/2006 |
| JP | 2006-232949 | 9/2006 |
| JP | 2006-286672 | 10/2006 |
| JP | 2007-186674 | 7/2007 |
| JP | 2007-302799 | 11/2007 |
| JP | 2008-050379 | 3/2008 |
| JP | 2009-013186 | 1/2009 |
| JP | 2009-055043 | 3/2009 |
| JP | 2009-132902 | 6/2009 |
| JP | 2009526089 | 7/2009 |
| JP | 2009-280664 | 12/2009 |
| JP | 2011-111506 | 6/2011 |
| KR | 10-2009-0023092 | 3/2009 |
| KR | 10-2009-0040097 | 4/2009 |
| WO | 2006/061747 | 6/2006 |
| WO | 2009051337 | 4/2009 |
| WO | 2010/060437 | 6/2010 |
| WO | 2011/045359 | 4/2011 |
| WO | 2012/1346629 | 10/2012 |

OTHER PUBLICATIONS

W. M. Yen et al., "Phosphor Handbook", 2nd Ed., CRC press (2007), pp. 470-479.
International Search Report dated Mar. 23, 2012 in International Application No. PCT/KR2011/005842.
Written Opinion dated Mar. 23, 2012 in International Application No. PCT/KR2011/005842.
International Search Report dated Mar. 26, 2012 in International Application No. PCT/KR2011/005607.
Written Opinion dated Mar. 26, 2012 in International Application No. PCT/KR2011/005607.
Non-Final Office Action dated Feb. 4, 2013 in U.S. Appl. No. 13/209,733.
Non-Final Office Action dated Apr. 25, 2013 in U.S. Appl. No. 13/184,271.
Notice of Allowance dated Jul. 5, 2013 in U.S. Appl. No. 13/209,733.
Final Office Action dated Nov. 22, 2013 in U.S. Appl. No. 13/184,271.
The First Office Action dated Feb. 8, 2014 in Chinese Patent Application No. 201180039682.1.
The Second Office Action dated Sep. 4, 2014 in Chinese Patent Application No. 201180039682.1.
TimeDomain CVD, Inc, (author unavailable), "TEOS/Oxygen Thermal CVD", http://vvvww.timedomaincvd.com/CVD_Fundamentals/films/TE0S_02_thermal.html, retrieved on Oct. 13, 2014.
Wang et al, "FTIR Analyses of SiOF Thin Film with Low Dielectric Constant", Research & Progress of SSE, Nov. 2001, vol. 21, No. 4, pp. 477-482.
Li et al, "An Optical Emission Spectroscopy Study of the Deposited Si02 Film with RF Cold Plasma at Atmosphericpressure", The Journal of Light Scattering, Dec. 2006, vol. 18, No. 4, pp. 360-364.
Non-Final Office Action dated Jun. 3, 2014 in U.S. Appl. No. 13/184,271.
Notice of allowance dated Sep. 22, 2014 in U.S. Appl. No. 13/134,271.
The extended European Search Report dated Sep. 22, 2014 in European Patent Application No. 11818314.
The extended European Search Report dated Sep. 22, 2014 in European Patent Application No. 11818337.
Non Final Office Action dated Jun. 15, 2015, in U.S. Appl. No. 14/076,738.
Non Final Office Action dated Feb. 10, 2015, in U.S. Appl. No. 14/076,642.
Notice of Allowance dated Jun. 23, 2015, in U.S. Appl. No. 14/076,642.
Supplemental Notice of Allowance dated Aug. 20, 2015, in U.S. Appl. No. 14/076,642.

(56) References Cited

OTHER PUBLICATIONS

Non-Final Office Action dated Jul. 11, 2016 in U.S. Appl. No. 14/858,641.
Notice of Allowance dated Nov. 18, 2016, in U.S. Appl. No. 14/858,641.
Non-Final Office Action dated Aug. 11, 2017, in U.S. Appl. No. 15/434,903.
Notice of Allowance dated Dec. 21, 2017, in U.S. Appl. No. 15/434,903.

* cited by examiner

LIGHT-EMITTING DEVICE HAVING SURFACE-MODIFIED LUMINOPHORES

CROSS REFERENCE TO RELATED APPLICATIONS

This application is a Continuation of U.S. patent application Ser. No. 15/434,903, filed on Feb. 16, 2017, which is a Continuation of U.S. patent application Ser. No. 14/858,641, filed on Sep. 18, 2015, now issued as U.S. Pat. No. 9,614,129, which is a continuation-in-part of U.S. application Ser. No. 14/076,642, filed on Nov. 11, 2013, now issued as U.S. Pat. No. 9,196,785, which is a continuation-in-part of U.S. application Ser. No. 13/209,733, filed on Aug. 15, 2011, now issued as U.S. Pat. No. 8,581,286, and claims priority from and the benefit of German Patent Application No. 10 2010 034 322.6, filed on Aug. 14, 2010, and Korean Patent Application No. 10-2010-0137026, filed on Dec. 28, 2010, which are all hereby incorporated by reference for all purposes as if fully set forth herein.

BACKGROUND

Field

Exemplary embodiments of the present invention relate to light emitting devices having inorganic luminophores, such as doped alkaline earth metal silicate compounds, and fluoride compounds and quantum dot semiconductor compounds, which are capable of converting high-energy primary radiation, i.e., for example, ultraviolet (UV) radiation or blue light, to a longer-wavelength secondary radiation within the visible spectral region, which can be used as radiation converters in light-emitting devices such as color or white-light emitting light emitting diodes (LEDs). Exemplary embodiments of the present invention also relate to light emitting devices having silicatic inorganic luminophores, fluoride luminophores or quantum dot luminophores which may have improved stability to air humidity and other environmental factors, and increased operational lifetime.

Discussion of the Background

Luminophores may be used in light sources, such as LEDs that emit colored or white light. In an LED, luminophores, which may be used in combination with other luminophores, are used to convert ultraviolet or blue primary radiation emitted from an LED into longer wavelength secondary radiation, in particular, white light.

Alkaline earth metal silicate luminophores, which include the europium-doped alkaline earth metal orthosilicates, the corresponding oxyorthosilicates and the disilicates of the Ba(Sr)$_3$MgSi$_2$O$_8$:Eu form, have been known for some time. An overview of the classification of the alkaline earth metal silicate compounds is documented by Hollemann-Wiberg, "Lehrbuch der Anorganischen Chemie" Inorganic Chemistry, 102 edition, (Walter de Gruyter & Co., Berlin, 2007). The preparation and the essential luminescence properties thereof have been described in detail in various patents and publications, for example: U.S. Pat. No. 6,489,716, issued to Tews, et al.; EP Appl. Pub. No. 0550937, applied for by Ouwerkerk, et al.; EP Appl. Pub. No. 0877070, applied for by Hase, et al.; and by W. M. Yen et al., "Phosphor Handbook", 2nd Ed., CRC Press (2007). These publications indicate that such luminophores have high quantum and radiation yields for the conversion of high-energy radiation to visible light, and numerous representatives of this luminophore class, due to these properties, may be used in products for lighting, illumination, and display technology.

However, the luminophores based on the alkaline earth metal silicates also have various disadvantageous properties. Some of the disadvantages include a comparatively low radiation stability and high sensitivity of the luminophores to water, air humidity, and other environmental factors. The sensitivity depends on the particular composition of the luminophore, structural conditions, and the nature of activator ions of the luminophores. Fluoride luminophores, such as hexafluorosilicate luminophores, may have similar disadvantages as alkaline earth metal silicates. In particular, fluoride luminophores with manganese activators may have a very low radiation stability and high sensitivity to water and air humidity. For some of the current applications of wavelength-conversion luminophores, these properties may be problematic. In view of the high lifetime demands, this may apply to LED applications. One known solution is to use suitable technologies and materials to generate (on the surface of pulverulent inorganic luminophores) barrier layers for reducing the influence of water vapor.

These processes may include encapsulation with organic polymers, coating with nanoscale oxides such as SiO$_2$ or Al$_2$O$_3$, or chemical vapor deposition (CVD) of such oxides. However, in relation to silicatic luminophores, the protection achievable may be insufficient to improve the lifetime of corresponding LED lamps to the desired degree. Furthermore, in the case of coated luminophores, it may be necessary to accept losses in brightness, shifts in the color location, and other quality losses. Processes for microencapsulation of the luminophore particles by means of gas phase processes may be inconvenient and costly.

Quantum dots also can be used as luminophores and their wavelengths become shorter as their sizes become smaller. Quantum dots are very reactive due to their small size, and thus, quantum dots have also a comparatively low radiation stability and high sensitivity to water, air humidity, and other environmental factors.

SUMMARY

Exemplary embodiments of the present invention provide light emitting devices employing silicate, fluoride, or quantum dot luminophores that may provide moisture stability, stability to radiation and other environmental influences, and improved operational lifetime.

Exemplary embodiments of the present invention also provide light emitting devices employing luminophores that have been subjected to a surface treatment with fluorinated inorganic or organic agents.

Exemplary embodiments of the present invention also provide detectable fixing of finely dispersed fluorides or fluorine compounds on the luminophore surface or the formation of surface networks of such compounds which are capable of making the luminophore surfaces hydrophobic and may cure surface defects.

Additional features of the invention will be set forth in the description which follows, and in part will be apparent from the description, or may be learned by practice of the invention.

An exemplary embodiment of the present invention discloses a light emitting device including a first light emitting diode and a surface-modified luminophore configured to absorb light emitted from the first light emitting diode and configured to emit light having a different wavelength from the absorbed light, wherein the surface-modified luminophore includes a luminophore including a manganese activator and a fluorine compound fixed to the luminophore.

An exemplary embodiment also discloses a light emitting device including a substrate, a first light-emitting diode disposed on the substrate, a molding member encapsulating the first light-emitting diode, and luminophores dispersed in the molding member and including a surface-modified luminophore, in which the surface-modified luminophore includes a fluorinated coating and a fluoride luminophore including a manganese activator, and the fluoride luminophore is selected from the group consisting of K2SiF6, Na2SiF6, Rb2SiF6, K2GeF6, Na2GeF6, and Rb2GeF6.

The fluorinated coating may include a surface fixed or cross-linked fluorine, or fluorine compounds.

The surface-modified luminophore may further include a moisture barrier layer.

The surface-modified luminophore further includes an additional coating comprising a non-fluorinated layer disposed on the fluorinated coating.

An exemplary embodiment still discloses a light emitting device including a substrate, a first light-emitting diode disposed on the substrate, a molding member encapsulating the first light-emitting diode, and luminophores dispersed in the molding member and including a green luminophore and a red luminophore including a surface-modified luminophore.

The surface-modified luminophore may include fluorinated coating and a manganese activator.

The fluorinated coating may include a surface fixed or cross-linked fluorine, or fluorine compound.

The surface-modified luminophore may include a fluoride luminophore selected from the group consisting of $K_2SiF_6$, $Na_2SiF_6$, $Rb_2SiF_6$, $K_2GeF_6$, $Na_2GeF_6$, and $Rb_2GeF_6$.

The green luminophore may include a quantum dot luminophore.

An exemplary embodiment further discloses a light emitting device including a housing, a plurality of heat-sinks adjoined to the housing and insulated from each other, a bottom surface of the heat-sinks being exposed to the outside, a light emitting diode mounted on at least one of the heat-sinks via a conductive adhesive, and a molding member encapsulating the light emitting diode and including thermosetting resin, in which a fluoride luminophore including I and IV group elements with fluorine and other luminophore are dispersed in the molding member, and the luminophores are configured to absorb at least a portion of light emitted from the light emitting diode and emit light having a wavelength different from that of the absorbed light.

The light emitting diode may include a plurality of light emitting cells separated from each other and disposed on the same substrate.

The light emitting cells may be electrically connected to one another in series.

The light emitting cells may be electrically connected to one another in parallel.

The light emitting device may be configured to be directly driven by an AC power supply.

The luminophores may be disposed on at least one of lateral, upper, and lower sides of the light emitting diode.

The luminophores may be dotted on the light emitting diode.

The luminophores may be uniformly distributed within the thermosetting resin of the molding member.

A moisture barrier layer may be formed in the luminophores.

A fluorinated coating may be formed in the luminophores.

It is to be understood that both the foregoing general description and the following detailed description are exemplary and explanatory and are intended to provide further explanation of the invention as claimed. Additional features of the invention will be set forth in the description which follows, and in part will be apparent from the description, or may be learned by practice of the invention.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain various aspects of the invention.

DETAILED DESCRIPTION OF THE ILLUSTRATED EMBODIMENTS

Figure 1:
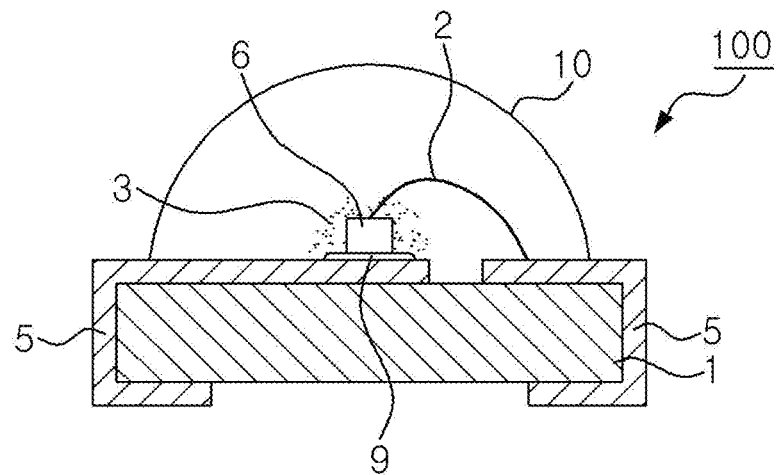
FIG. 1 is a cross-sectional view of a light emitting device 100, according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

According to exemplary embodiments of the present disclosure, a light emitting device includes a light emitting diode that emits light in the UV or visible range, and a surface-modified luminorphore disposed around the light emitting diode to absorb at least a portion of light emitted from the light emitting diode and to emit light having a different wavelength from the absorbed light.

On excitation with high-energy UV radiation, blue light, electron beams, X-rays or gamma rays and, depending on their specific chemical composition and the nature of an activator, the luminophores according to exemplary embodiments of the present invention may emit visible light and infrared radiation with high radiation yields and significantly improved stability to $H_2O$, air humidity, and other environmental factors compared to the prior art. For this reason, they may be used in long-life industrial products, for example in cathode ray tubes and other image-generating systems (scanning laser beam systems) in X-ray image converters, high-performance light sources, LEDs of all colors for interior and exterior illumination, backlighting of LCD displays, solar cells, greenhouse films, and glasses as radiation converters.

Luminophores according to exemplary embodiments of the present invention, including surface-modified silicate luminophores, may be characterized in that the surface thereof has a coating of fluorinated inorganic or organic agents for generation of hydrophobic surface sites, or of a combination of the fluorinated coating with one or more moisture barrier layers. The moisture barrier layers may be formed using layer-forming materials such as at least one of the oxides MgO, $Al_2O_3$, $Ln_2O_3$ (wherein Ln=Y, La, Gd, or Lu), and $SiO_2$, or the corresponding precursors, and sol-gel technologies.

Luminophores, including surface-modified luminophores, according to exemplary embodiments of the present invention may include pulverulent alkali or alkaline earth metal silicate luminophores. The surface-modified luminophores may have the general formula:

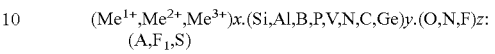

$(Me^{1+}, Me^{2+}, Me^{3+})x.(Si,Al,B,P,V,N,C,Ge)y.(O,N,F)z:$
$(A,F_1,S)$ where A is an activator selected from the group of the lanthanoids or manganese; $F_1$ is a surface fixed and optionally cross-linked fluorine or fluorine compounds; and S characterizes an optional additional coating with non-fluorinated layer-forming materials. $Me^{1+}$ is a monovalent metal, $Me^{2+}$ is a divalent metal and $Me^{3+}$ is a trivalent metal selected from group III of the Periodic Table or from the lanthanoids. Silicon may be replaced by P, Al, B, V, N, Ge, or C. The coefficients x, y, and z may have the following ranges: $0<x<5$, $0<y<12$, and $0<z<24$.

The surface modified silicate luminophores may be alkaline earth metal silicates. According to exemplary embodiments of the present invention, which may optimize luminescence properties and stability performance, some of the alkaline earth metal ions in the surface-modified silicate luminophores may be replaced by further divalent ions, for example Mg, Zn, or, with implementation of suitable measures for balancing the charge, monovalent or trivalent cations from the group of alkali metals or of the rare earths. Further, P, B, V, N, Ge, or C can be incorporated into an anion sublattice of the surface-modified silicate luminophores replacing some of the silicon.

According to exemplary embodiments of the present invention, the alkaline earth metal silicate luminophores may be fluorinated using fluorine-functionalized organosilanes of the $Si(OR)_3X$ form where $R=CH_3, C_2H_5, \ldots$, and X=a F-functionalized organic ligand, and controlled hydrolysis and condensation may achieve the formation of a fluorinated barrier layer on a silicatic luminophore matrix, which may be a barrier and may also have hydrophobic properties.

The surface-modified silicate luminophores according to exemplary embodiments of the present invention, may be characterized by the general formula:

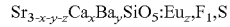

$Sr_{3-x-y-z}Ca_xBa_ySiO_5:Eu_z,F_1,S$ wherein $0 \leq x \leq 2$, $0 \leq y \leq 2$ and $0<z<0.5$. The surface-modified silicate luminophores according to exemplary embodiments of the present invention, may also be characterized by the formula:

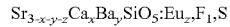

$Sr_{3-x-y-z}Ca_xBa_ySiO_5:Eu_z,F_1,S$ wherein $0 \leq x \leq 0.05$, $0 \leq y \leq 0.5$ and $0<z<0.25$.

As discussed above, silicate luminophores are surface modified with a coating including a fluorinated coating. However, the application of the fluorinated coating is not limited on the alkaline earth metal silicate luminophores. The luminophores may be hexafluorosilicate luminophores or fluoride luminophores. The fluorinated coating can also be applied to quantum dot (QD) luminophores. Semiconductor quantum dot luminophores convert high energy radiation into visible light, based on their band gap structure. In addition, quantum dot luminophores are very reactive due to their small size, and thus, quantum dots have also a comparatively low radiation stability. Quantum dot and fluoride luminophores have high sensitivity to water, air humidity, and other environmental factors.

The QD luminophore may comprise a II-VI or III-V group compound semiconductor QD luminophore. The II-VI group compound semiconductor QD luminophore may comprise CdSe or CdS, and the III-V group compound semiconductor QD luminophore may comprise AlInGaP, AlInGaAs, or AlInGaN, but the invention is not limited thereto.

The fluoride luminophore may comprise I and IV group elements with fluorine. The I and IV group compound fluoride luminophore may comprise $K_2SiF_6$, $Na_2SiF_6$, $Rb_2SiF_6$, $K_2GeF_6$, $Na_2GeF_6$, $Rb_2GeF_6$, but the invention is not limited thereto.

The light emitting device, according to the exemplary embodiments of the present invention, may emit white light or a desired color of light through a combination of the light emitted from the light emitting diode and the luminophore. Furthermore, other luminophores may be added to the light emitting device to emit another desired color of light. The luminophores may be disposed on at least one of lateral, upper, and lower sides of the light emitting diode. Further, the luminophores may be mixed with an adhesive or a molding material, which may be disposed on the light emitting diode.

An exemplary embodiment of the present invention discloses a light emitting device including a quantum dot (QD) and fluoride luminophores. According to the present exemplary embodiment, a quantum dot (QD) luminophore may emit green light and the fluoride luminophore may emit red light. Specifically, the quantum dot (QD) luminophore may have a peak spectrum range of 490-560 nm and the fluoride luminophore may have a peak spectrum range of 560-660 nm. More specifically, the quantum dot (QD) luminophore may have a peak spectrum range of 525-550 nm and the fluoride luminophore may have a peak spectrum range of 625-635 nm.

The light emitting diode and the luminophores may be combined in a single package. According to an exemplary embodiment of the present invention, the light emitting device may further include another light emitting diode in the package. The other light emitting diode may emit light having the same wavelength as, or a different wavelength from, the light emitted from the light emitting diode. For example, the other light emitting diode may emit light having a longer wavelength than an emission peak wavelength of the luminophore.

The package may include a substrate such as a printed circuit board or lead frame, on which the light emitting diode is mounted. According to one exemplary embodiment of the present invention, the package may further include a reflector that reflects light emitted from the light emitting diode. In the present exemplary embodiment, the light emitting diode is mounted within the reflector.

The light emitting device may further include a molding member that encapsulates the light emitting diode on the substrate. The luminophores may be dispersed in the molding member, but are not limited thereto. The package may further include a heat sink, and the light emitting diode may be mounted on the heat sink.

According to exemplary embodiments of the present invention, the light emitting diode may be formed of (Al, Ga, In)N-based compound semiconductors. The light emitting diode may have, for example, a double-hetero structure, a single quantum well structure, or multi-quantum well structure, wherein a single active region is arranged between an n-type semiconductor layer and a p-type semiconductor layer.

The light emitting diode may further include a plurality of light emitting cells that are separated from each other and disposed on a single substrate. Each of the light emitting cells may have an active region. The light emitting cells may be electrically connected to one another in series and/or in parallel, via wires. With these light emitting cells, it is possible to provide an alternating current (AC) light emitting diode which may be directly driven by an AC power supply. Such an AC-light emitting diode may be driven without an additional AC/DC converter, by forming a bridge rectifier and serial arrays of light emitting cells connected to the bridge rectifier on a single substrate, or by forming serial arrays of light emitting cells connected in reverse-parallel to one another on a single substrate.

FIG. 1 is a cross-sectional view of a light emitting device 100 according to an exemplary embodiment of the present invention. The light emitting device 100 may be referred to as a chip-type package. Referring to FIG. 1, electrodes 5 may be formed on both sides of a substrate 1, and a light emitting diode 6 to emit primary light may be mounted on one of the electrodes 5, at one side of the substrate 1. The light emitting diode 6 may be mounted on the electrode 5 via an electrically conductive adhesive 9, such as Ag epoxy, and may be electrically connected to the other electrode 5 via an electrically conductive wire 2. The light emitting diode 6 emits light in the ultraviolet range or visible range and may be formed of gallium nitride-based compound semiconductors. The light emitting diode 6 may emit UV or blue light.

Luminophores 3 may be dotted on upper and side surfaces of the light emitting diode 6. A molding member 10, for example, a thermosetting resin, encapsulates the light emitting diode 6. The luminophores 3 are dotted around the light emitting diode 6, but are not limited to any particular configuration. For example, the luminophores 3 may be uniformly distributed within the molding member 10. The luminophores 3 absorb at least a portion of light emitted from the light emitting diode 6 and emit light having a different wavelength from the absorbed light.

The light emitting diode 6 is electrically connected to an external power supply via the electrodes 5 and thus, may emit primary light. The luminophores 3 absorb at least a portion of the primary light and emit secondary light having a wavelength that is longer than that of the primary light. As a result, the primary light and the secondary light are mixed to form mixed light, which is emitted from the light emitting device 100. A desired color of light, for example white light, may be realized in this manner.

The light emitting device 100 may include one or more additional light emitting diodes. These light emitting diodes may emit light having the same emission peaks or different emission peaks. For example, the light emitting device 100 may include the same or different types of light emitting diodes, each of which can emit ultraviolet or blue light. Furthermore, the light emitting device 100 may include a light emitting diode that can emit light having a longer wavelength than the emission peak wavelength of the luminophores. Such a longer wavelength light emitting diode may be employed to improve a color rendering index of the light emitting device 100. Moreover, the light emitting device 100 may further include other luminophores in addition to the luminophores 3. Examples of the other luminophores include, but are not limited to, orthosilicate luminophores, Yttrium Aluminum Garnet (YAG) based luminophores, and thiogallate luminophores. Accordingly, a desired color of light may be achieved by the proper selection of the light emitting diodes 6 and luminophores.

Figure 2:
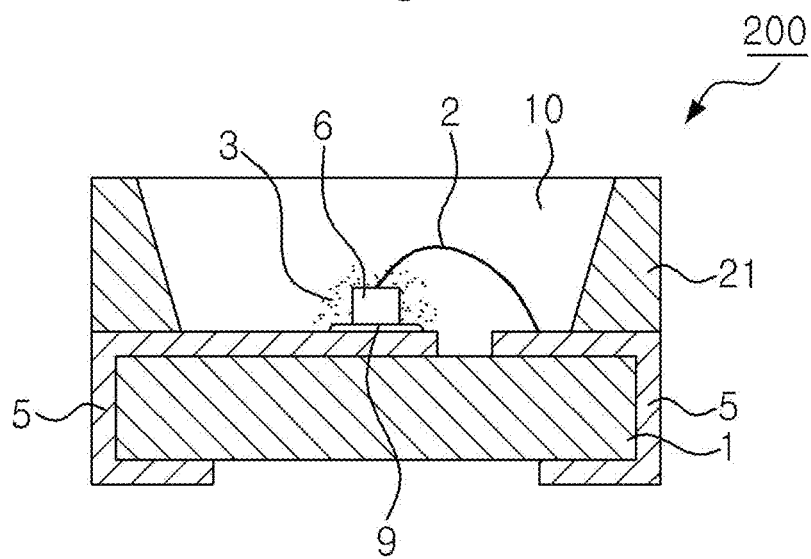
FIG. 2 is a cross-sectional view of a light emitting device 200, according to an exemplary embodiment of the present invention.

FIG. 2 is a cross-sectional view of a light emitting device 200, according to another exemplary embodiment of the present invention. The light emitting device 200 may be referred to as a top-view type package. Referring to FIG. 2, the light emitting device 200 has a similar structure to the light emitting device 100 and further includes a reflector 21 on a substrate 1. A light emitting diode 6 is mounted in the reflector 21. The reflector 21 reflects light emitted from the light emitting diode 6, to increase brightness within a certain viewing angle.

Luminophores 3 are disposed around the light emitting diode 6, absorb at least a portion of the light emitted from the light emitting diode 6, and emit light having a different wavelength than the absorbed light. The luminophores 3 may be dotted on the light emitting diode 6 or may be uniformly distributed within a thermosetting resin molding member 10.

The light emitting device 200 may also include one or more additional light emitting diodes, which emit light having the same emission peaks or different emission peaks from one another, and may further include other luminophores in addition to the luminophores 3.

The light emitting devices 100, 200 may include substrates 1 formed of a metallic material, for example a metal printed circuit board (PCB), which exhibits good thermal conductivity. Such a substrate may easily dissipate heat from the light emitting diode 6. Further, a lead frame including lead terminals may be used as the substrate 1. Such a lead frame may be surrounded and supported by the molding member 10, which encapsulates the light emitting diode 6.

In the light emitting device 200, the reflector 21 may be formed of a different material from the substrate 1, although is not limited thereto. For example, the reflector 21 may be formed of the same type of material as the substrate 1. A lead frame having lead terminals may be integrally formed with the substrate 1 and reflector 21, by insert-molding plastics such as polyphthalamide (PPA). Then, the lead terminals may be bent to form the electrodes 5.

Figure 3:
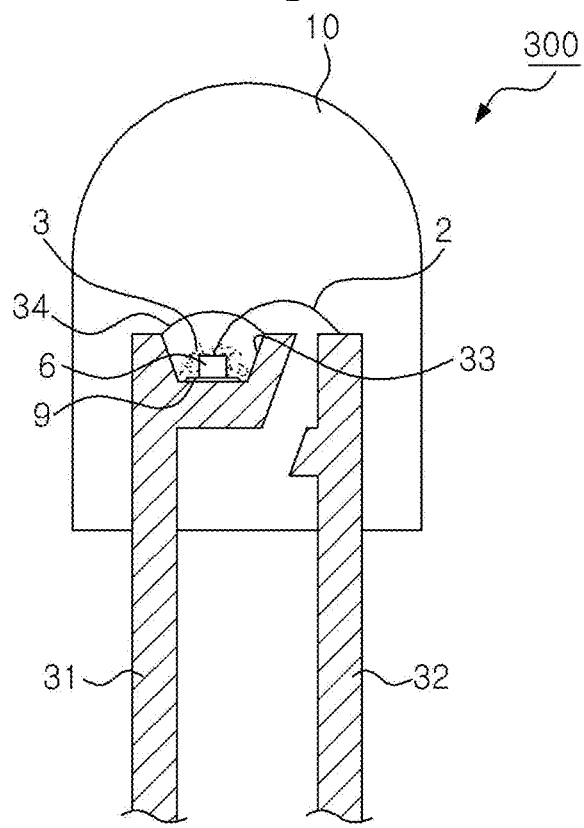
FIG. 3 is a cross-sectional view of a light emitting device 300, according to an exemplary embodiment of the present invention.

FIG. 3 is a cross-sectional view of a light emitting device 300, according to another exemplary embodiment of the present invention. The light emitting device 300 may be referred to as a light emitting diode lamp. Referring to FIG. 3, the light emitting device 300 includes a pair of lead electrodes 31, 32 and a cup portion 33 having a cup shape, at an upper end of one lead electrode 31. At least one light emitting diode 6 may be mounted in the cup portion 33 via an electrically conductive adhesive 9 and electrically connected to the other lead electrode 32 via a conductive wire 2. When a plurality of light emitting diodes is mounted within the cup portion 33, the light emitting diodes may emit light having the same wavelength or different wavelengths from one another.

Luminophores 3 are disposed around the light emitting diode 6. The luminophores 3 absorb at least a portion of light emitted from the light emitting diode 6 and emit light having a different wavelength from that of the absorbed light. The luminophores 3 may be dotted on the light emitting diode 6 in the cup portion 33, or uniformly distributed within a thermosetting resin molding member 34 formed in the cup portion 33.

A molding member 10 encapsulates the light emitting diode 6, the luminophores, and a portion of the lead electrodes 31, 32. The molding member 10 may be formed of, for example, epoxy or silicone. In the present exemplary embodiment, the light emitting device 300 includes the pair of lead electrodes 31, 32. However, the light emitting device 300 may have more lead electrodes than the pair of lead electrodes 31, 32.

Figure 4:
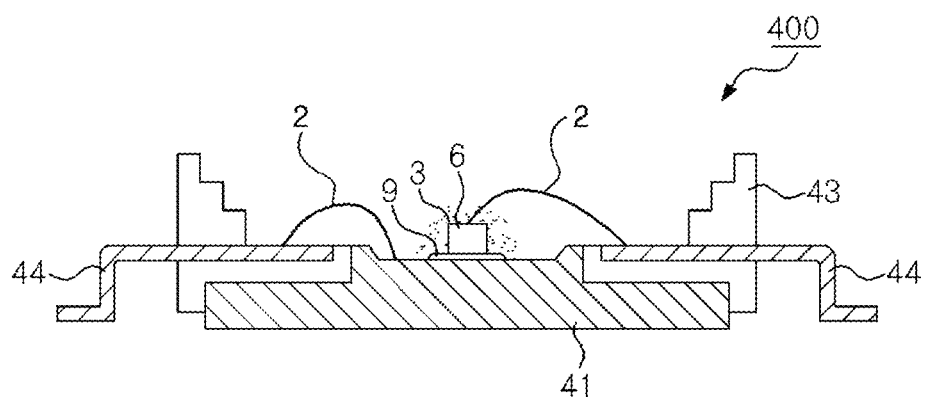
FIG. 4 is a cross-sectional view of a light emitting device 400, according to an exemplary embodiment of the present invention.

FIG. 4 is a cross-sectional view of a light emitting device 400, according to yet another exemplary embodiment of the present invention. The light emitting device 400 may be referred to as a high-power light emitting diode package. Referring to FIG. 4, the light emitting device 400 includes a heat sink 41 that is received in a housing 43. The heat sink 41 has a bottom surface that is exposed to outside. Lead electrodes 44 are exposed within the housing 43 and extend outside through the housing 43. At least one light emitting diode 6 may be mounted on an upper surface of the heat sink 41, via an electrically conductive adhesive 9. The light emitting diode 6 is electrically connected to one of the lead electrodes 44, via an electrically conductive wire 2. Furthermore, another electrically conductive wire 2 connects the other lead electrode 44 to the heat-sink 41, such that the light emitting diode 6 may be electrically connected to each of the two lead electrodes 44.

Luminophores 3 are disposed around the light emitting diode 6, on the heat-sink 41. The luminophores 3 adsorb at least a portion of light emitted from the light emitting diode 6 and emit light having a different wavelength from that of the absorbed light. The luminophores 3 may be dotted on the light emitting diode 6, or uniformly distributed within a molding member (not shown), to cover the light emitting diode.

Figure 5:
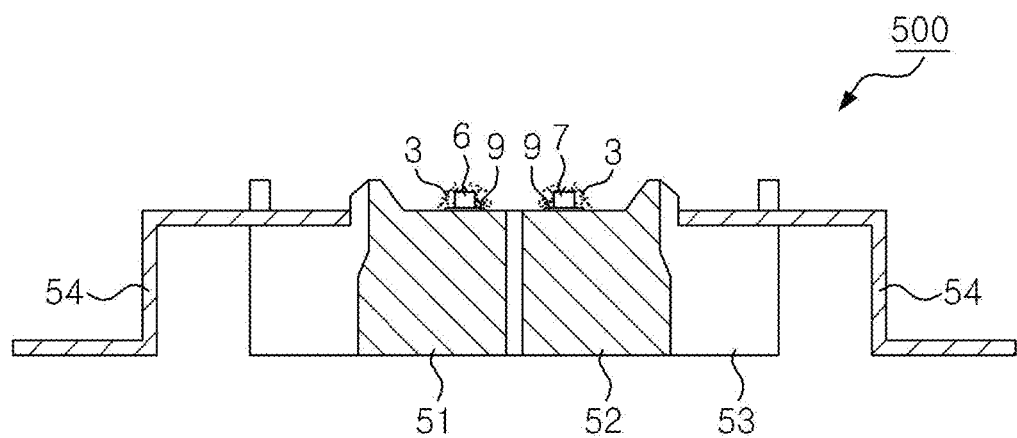
FIG. 5 is a cross-sectional view of a light emitting device 500, according to an exemplary embodiment of the present invention.

FIG. 5 is a cross-sectional view of a light emitting device 500, according to yet another exemplary embodiment of the present invention. Referring to FIG. 5, the light emitting device 500 includes a housing 53 and a plurality of heat-sinks 51, 52 that may be joined to the housing 53 and insulated from each other. Light emitting diodes 6, 7 are mounted on the heat-sinks 51, 52, via an electrically conductive adhesive. The light emitting diodes 6, 7 are electrically connected to lead electrodes 54, via respective electrically conductive wires (not shown). The lead electrodes 54 extend from the inside of the housing 53 to the outside. Each of the light emitting diodes 6, 7 is connected to two of the lead electrodes 54, but more lead electrodes may be provided thereto. Luminophores 3 may be disposed around at least one of the light emitting diodes 6 or 7, as described with reference to FIG. 4.

In the above exemplary embodiments, the light emitting diode 6 may be mounted on the substrate 1 or on the heat-sink 41, via the electrically conductive adhesive 9, and electrically connected to the electrode or lead electrode via the electrically conductive wire 2. When the light emitting diode 6 is a "two-bond die", which has two electrodes on the top side thereof, the light emitting diode 6 may be electrically connected to the electrodes or lead electrodes via two electrically conductive wires, respectively. Thus, the adhesive need not be electrically conductive.

In some exemplary embodiments, the light emitting diode 6 may be formed of an (Al, Ga, In)N-based composite semiconductor. The light emitting diode 6 may have, for example, a double hetero-structure, single quantum well structure, or multi-quantum well structure, which may have a single active region arranged between n-type and p-type semiconductor layers.

Luminophore powders used as the basis for the preparation of the surface-modified silicate luminophores 3 according to an exemplary embodiment of the present invention may be synthesized by multistage high-temperature solid-state reactions at temperatures above 1000° C. between the alkaline earth metal carbonates that may be used as the starting material or the corresponding metal oxides and $SiO_2$. Additionally, mineralization additives (e.g. $NH_4Cl$, $NH_4F$, or alkali metal or alkaline earth metal halides or halides of the trivalent metals) may be added to the reaction mixture to promote reactivity and to control the particle size distribution of the resulting luminophores. Depending on the specific selection of the stoichiometric ratios, it may be possible to produce the desired compositions of the doped alkaline earth metal silicate luminophores, more particularly the corresponding ortho- and oxyortho-silicate luminophores.

Accordingly, the calculated amounts of the starting materials are mixed vigorously and then subjected to a multistage calcination process in an inert or reducing atmosphere within the desired temperature range. For the purpose of optimizing the luminophore properties, the main calcination process may optionally also have several calcination stages within different temperature ranges. After the calcination process has ended, the samples are cooled to room temperature and subjected to suitable after-treatment processes that are directed, for example, to the elimination of flux residues, to the minimization of surface defects, or else to the fine adjustment of the particle size distribution. Instead of the silicon oxide, it is alternatively also possible to use silicon nitride ($Si_3N_4$) or other silicon-containing precursors as reactants for the reaction with the alkaline earth metal compounds used. The synthesis of the polycrystalline luminophore powders used for the production of exemplary embodiments of the luminophores is not restricted to the preparation processes described above.

For the fluorination of the surfaces of the pulverulent alkaline earth metal silicate luminophores according to the present invention, different inorganic fluorine compounds may be used such as alkali metal fluorides (e.g. LiF, NaF, KF) alkaline earth metal fluorides ($MgF_2$, $CaF_2$, $SrF_2$, $BaF_2$), $AlF_3$ and fluorides of the rare earths (e.g. $YF_3$, $LaF_3$ or $GdF_3$), $NH_4F$ and $NH_4HF_2$, and also other inorganic or organic fluorine compounds (e.g. fluoride-containing amines). The materials selected are mixed with the silicatic luminophore powders, in which case aqueous suspensions may be employed. The required proportions of the fluorinating agents added depend on the solubility of the compounds and on the reaction conditions (pH, temperature, intensity of mixing, residence time, etc.) and may be determined experimentally.

After the surface treatment has ended, the fluorinated luminophores are removed from the suspension, and may be washed with suitable solvents and then dried at temperatures between 80° C. and 200° C. After cooling and screening, they are in a form ready for use.

For the achievement of optimal luminophore properties, depending on the specific composition of the inventive luminophores, on the type and amount of the fluorinating agents used, and further factors, to subject the luminophores produced in accordance with the invention, additionally or instead of the drying process, to a thermal after-treatment (heat treatment) within a temperature range from 300° C. to 600° C. in a reducing atmosphere. Detailed information regarding the production of the luminophores according to exemplary embodiments of the present invention is given hereinafter by several working examples.

WORKING EXAMPLE A1

Figure 6A:
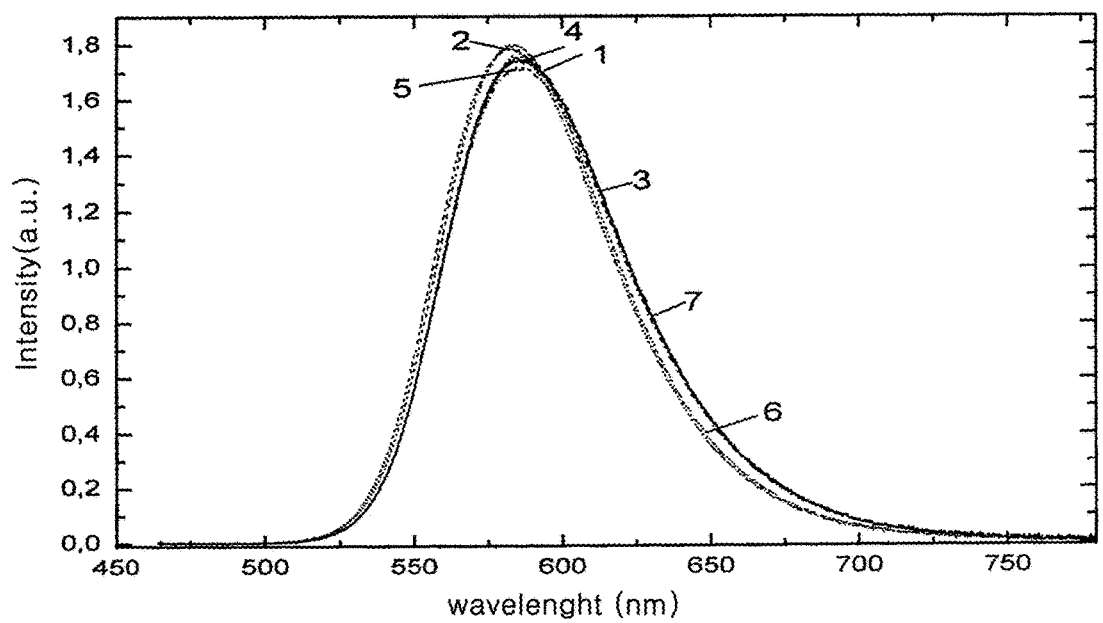
FIG. 6a is emission spectra of a reference material $Sr_{2.9}Ba_{0.01}Ca_{0.05}Eu_{0.04}SiO_5$, a commercial $Sr_3SiO_5$:Eu luminophore, and oxyorthosilicate luminophores F-103, F-202, F-202T, F-320 and F-TS-600 according to exemplary embodiments of the present invention.

Working Example A1 describes the preparation of a luminophore provided with a fluorinated surface layer and having the base lattice composition $Sr_{2.9}Ba_{0.01}Ca_{0.05}SiO_5$:$Eu_{0.04}$ according to an exemplary embodiment of the present invention, which is described as sample F-103 together with its optical data in Table 1, and the emission spectrum that is designated as "3" in FIG. 6a.

Table 1 contains optical and moisture stability data of europium-activated strontium oxyorthosilicate luminophore samples which have been treated with different amounts of $NH_4F$. To synthesize the corresponding luminophore matrix, the stoichiometric amounts of $SrCO_3$, $BaCO_3$, $CaCO_3$, $Eu_2O_3$, and $SiO_2$ and 0.2 mol of $NH_4Cl$ are mixed vigorously and then subjected, in corundum crucibles, to a 5-hour calcination process at 1400° C. in an $N_2/H_2$ atmosphere containing 2% hydrogen. After the calcination process has ended, the calcinated material is homogenized, ground and washed with $H_2O$. Subsequently, 100 g of the dried and screened luminophore are introduced together with 1.1 g of $NH_4F$, 200 g of glass beads and 1 liter of water into a suitable plastic vessel and mixed vigorously on a jar mill at low speed for 30 minutes. After a settling time of several minutes, the supernatant is first decanted and then filtered with suction through a Buchner funnel. This is followed by drying and screening of the end product.

WORKING EXAMPLE A2

To prepare the luminophore containing sample F-202 according to an exemplary embodiment of the present invention, the optical data of which are specified in Table 2 and the emission spectrum of which is designated as "4" in FIG. 6a, 100 g of the luminophore matrix described in Working Example A1 are mixed with 2.474 g of $NH_4HF_2$. Table 2 contains optical and moisture stability data of europium-activated strontium oxyorthcsilicate luminophore samples which have been treated with different amounts of $NH_4HF_2$. In this case, the fluorinated surface layer is applied by wet-chemical precipitation by taking the mixture in 1 L of deionized water and 400 g of glass beads on a roll mill. Treatment for one hour is followed by the removal of the coated luminophore from the solution and an after-treatment analogous to Working Example A1.

WORKING EXAMPLE A3

Here, 30 g of the luminophore produced according to Working Example A2 are heat treated in a corundum crucible at 400° C. in an $N_2/H_2$ atmosphere containing 35% hydrogen for 60 minutes. After cooling, the sample F-202T, the optical data of which are specified in Table 2 and the emission spectrum of which is designated as "5" in FIG. 6a, is homogenized by screening to produce an exemplary embodiment of the present invention.

WORKING EXAMPLE A4

An oxyorthosilicate luminophore with a base lattice composition $Sr_{2.948}Ba_{0.01}Cu_{0.002}SiO_5$:$Eu_{0.04}$ according to an exemplary embodiment of the present invention is synthesized in the solid state according to Working Example A1 and coated with an $SiO_2$ network using precursor material tetraethoxysilane (TEOS). For this purpose, 50 g of the luminophore are mixed with 500 mL of a solution of 1 L of ethanol, 18.2 g of TEOS and 100 mL of 32% aqueous ammonia, and stirred in a reaction vessel for 2 hours. Thereafter, the coated luminophore is filtered with suction, washed with ethanol, and dried at 160° C. for 24 hours.

After this preparative surface treatment, the luminophore is subjected, as in Working Example A1, to fluorination by NH$_4$F as the fluorinating agent. For this purpose, 80 g of the precoated luminophore is reacted with 1.98 g of NH$_4$F under the conditions of Working Example A1. The luminophore according to the present exemplary embodiment is thus produced, in the form of sample F-TS-600. The optical data of which are described in Table 6, and the emission spectrum of which is designated as "7" in FIG. 6a, like the luminophore described in Working Examples A1, A2, and A3, and may have a significantly improved moisture resistance compared to conventional oxyorthosilicate luminophores and the same base lattice composition as the uncoated base luminophores. The performance characteristics of these luminophores according to the exemplary embodiments of the present invention are compiled in Tables 1, 2 and 6.

WORKING EXAMPLE B1

For the production of the luminophore according to an exemplary embodiment of the present invention in the form of sample F-320, a base lattice of the composition Sr$_{2.9485}$Ba$_{0.01}$Cu$_{0.0015}$SiO$_5$:Eu$_{0.04}$ is synthesized. For this purpose, the stoichiometric amounts of SrCO$_3$, BaCO$_3$, CuO, Eu$_2$O$_3$, 65 g of SiO$_2$ and 0.3 mol of NH$_4$Cl are mixed, introduced into suitable calcining crucibles and calcined in a high-temperature furnace for a period of 24 hours. The calcination program has two main calcination zones at 1200° C. and 1350° C. for 3 hours at each temperature. During the first calcination phase, calcination is effected under forming gas with hydrogen concentration 5%, and the hydrogen concentration is increased to 20% in the subsequent second phase of calcination.

The cooling, washing and homogenization of the matrix material are followed by the fluorination of the luminophore surface. To this end, the fluorinating agent used is aluminum fluoride AlF$_3$ instead of the NH$_4$F or the NH$_4$HF$_2$. For interaction with the surface of the luminophore particles, 1.2 g of AlF$_3$ are introduced into 1 L of H$_2$O at 60° C. and the mixture is stirred vigorously for 1 hour. Subsequently, 100 g of the luminophore matrix synthesized are added to the suspension. The reaction time may be 60 minutes. The coated luminophore in the form of sample F-320 is aftertreated similarly to Working Examples A1, A2, A3, and A4. The optical data are shown in Table 3, and the emission spectrum thereof is designated as "6" in FIG. 6a. Table 3 contains optical and stability data of further fluorinated Eu$^{2+}$-doped strontium oxyorthosilicate luminophores.

WORKING EXAMPLE C1

The working examples which follow relate to alkaline earth metal orthosilicate luminophores coated in accordance with exemplary embodiments of the present invention and having a composition of Sr$_{0.876}$Ba$_{1.024}$SiO$_4$:Eu$_{0.1}$. In the present exemplary embodiment, the base material is produced by a high-temperature solid-state reaction wherein the starting mixture comprises stoichiometric amounts of SrCO$_3$, BaCO$_3$, Eu$_2$O$_3$, SiO$_2$, and 0.2 mol of NH$_4$Cl.

The calcination process includes heating the crucible filled with the starting mixture to 1275° C. in a nitrogen atmosphere, maintaining this temperature over a period of 10 hours and subsequently cooling to room temperature. On attainment of the high-temperature ramp, 20% hydrogen is added to the protective gas. After cooling, the resulting materials are subjected to washing to remove flux residues, and then dried and screened.

For fluorination of the base material, 150 g of the luminophore powder and 4.268 g of NH$_4$F are suspended in 3 L of H$_2$O and stirred over a period of 2 hours. After the coating procedure has ended, the fluorinated luminophore is filtered with suction to give sample F-401, washed with ethanol on the suction filter, and dried at 130° C. for 24 hours. The optical data of sample F-401 are shown in Table 4, and F-401's emission spectrum is designated as "3" in FIG. 6b. Table 4 contains optical and stability data of fluorinated green-wavelength emitting alkaline earth metal orthosilicate luminophores that have additionally been coated with SiO$_2$.

In a further step, the luminophore according to the present exemplary embodiment in the form of sample F-401 may be provided with an SiO$_2$ coating. For this purpose, 50 g of the fluorinated Sr$_{0.876}$Ba$_{1.024}$SiO$_4$:Eu$_{0.1}$ luminophore powder are added to 500 mL of TEOS solution consisting of 1 L of ethanol, 25 g of TEOS and 150 mL of 32% aqueous ammonia, which has been prepared 24 hours before use. After a stirring time of 5 hours, reaction is terminated. The surface-coated luminophore in the form of sample F-401TS is filtered with suction, washed with ethanol again, and dried. The optical data of the sample F-401TS are specified in Table 4, F-401TS's emission spectrum is designated as "4" in FIG. 6b.

Figure 6B:
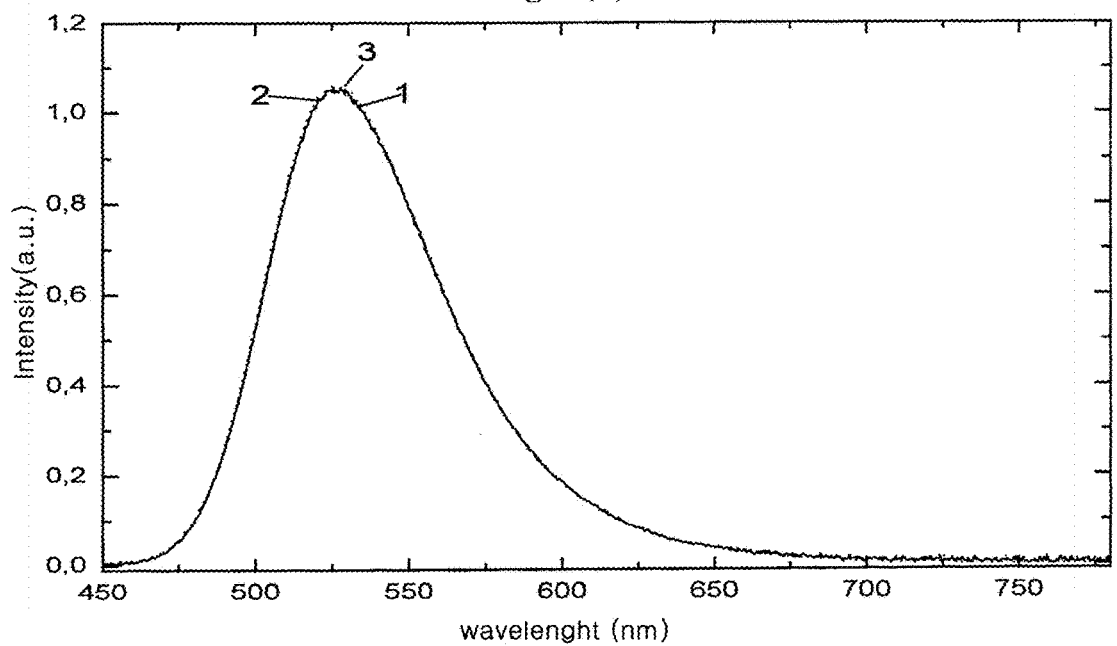
FIG. 6b is emission spectra of reference material $Sr_{0.876}Ba_{1.024}Eu_{0.1}SiO_4$ and two alkaline earth metal orthosilicate luminophores F-401 and F-401TS according to exemplary embodiments of the present invention.

The emission spectra of the fluorinated luminophores of different matrix composition compared to the luminophores untreated in each case are described in FIG. 1a and FIG. 6b, which show that the luminescence intensities of the luminophores with fluorinated surface structure according to the exemplary embodiments of the present invention differ slightly from those of the reference material. This is also confirmed by the luminescence data of the luminophore samples according to exemplary embodiments compiled in Table 1, Table 2, Table 3, Table 4, Table 5, Table 6, and Table 7 while somewhat lower luminescence intensities were measured in some cases for fluorinated and optionally additionally SiO$_2$ coated samples. There are also examples in the tables referred to for surface treatment leading to a slight increase in luminescence efficiency. The latter effect may be attributed to the somewhat better emission of light in the case of the coated materials.

Figure 7A:
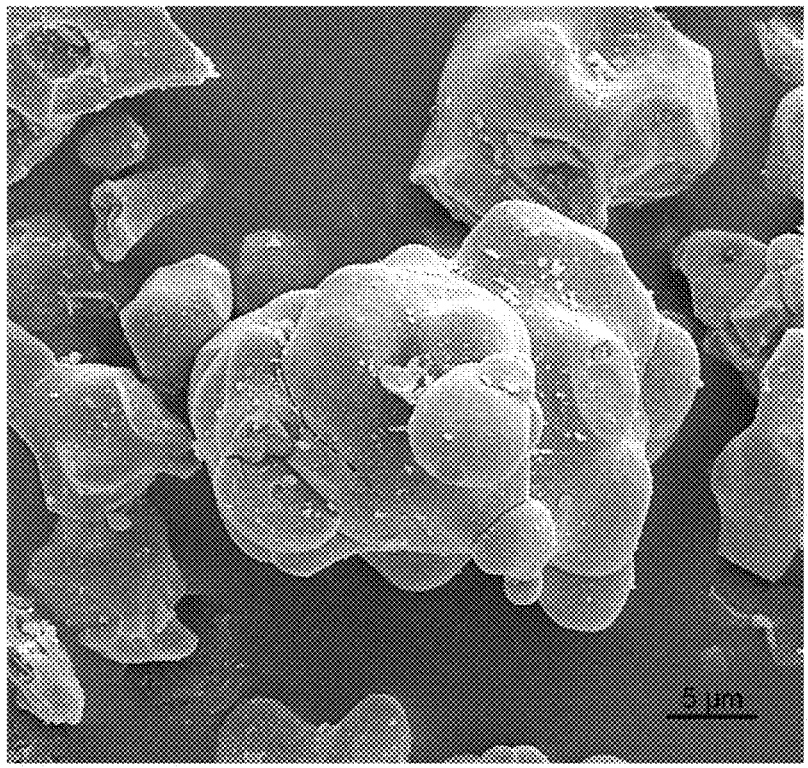
FIG. 7a is electron micrographs of non-fluorinated and fluorinated alkaline earth metal oxyorthosilicate luminophores, showing untreated particles of the luminophore $Sr_{2.9}Ba_{0.01}Ca_{0.05}SiO$ on the left and fluorinated particles of the luminophore F-202 according to an exemplary embodiment of the present invention on the right.
Figure 7A:
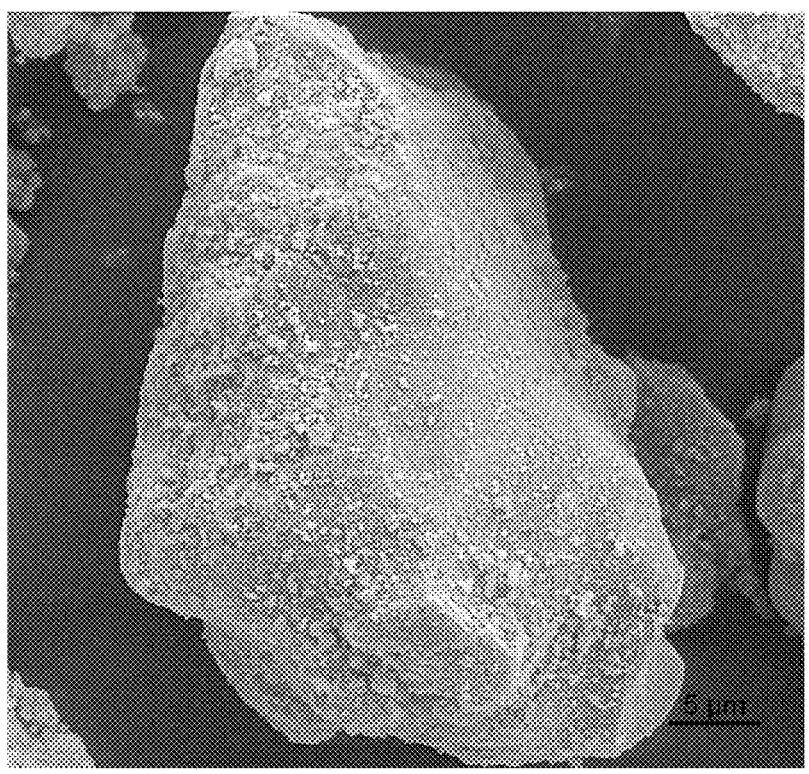
Figure 7B:
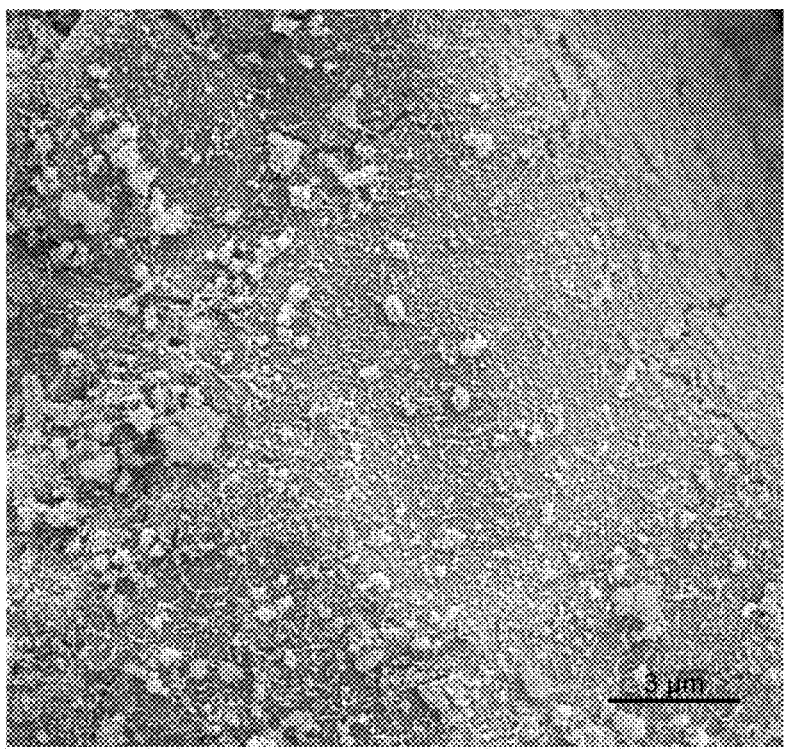
FIG. 7b includes magnified electron micrographs of the surface of the luminophore F-202 according to an exemplary embodiment of the present invention.
Figure 7B:

In FIG. 7a and FIG. 7b, electron micrographs of a fluorinated Sr$_3$SiO$_5$:Eu luminophore according to exemplary embodiments of the present invention are compared to those of the untreated starting material. These micrographs demonstrate that the surface treatment, described in the working examples, with suitable fluorinating agents leads to the formation of specific surface structures, which can be visualized with the aid of scanning electron micrographs.

Figure 8:
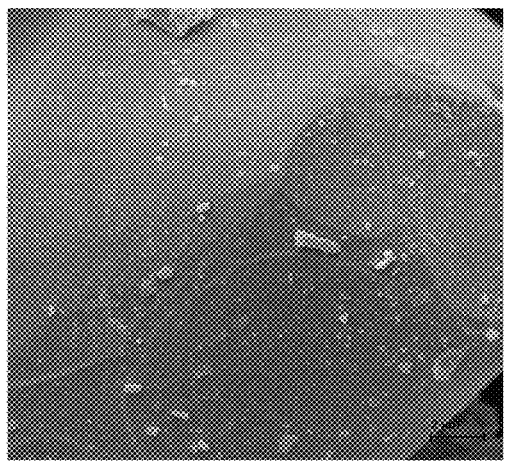
FIG. 8 includes electron micrographs of uncoated, fluorinated, and $SiO_2$-coated alkaline earth metal orthosilicate luminophores of the base lattice composition $Sr_{0.876}Ba_{1.024}SiO_4$:$Eu_{0.1}$, showing a scanning electron micrograph of the uncoated starting material on the left, the fluorinated luminophore surface in the middle, and a luminophore sample additionally coated with $SiO_2$ on the right according to an exemplary embodiment of the present invention.
Figure 8:
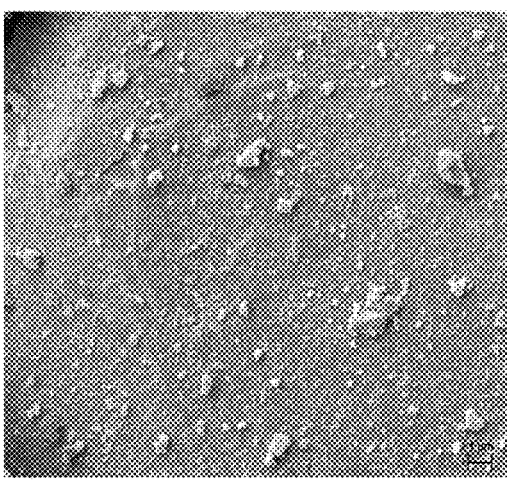
Figure 8:
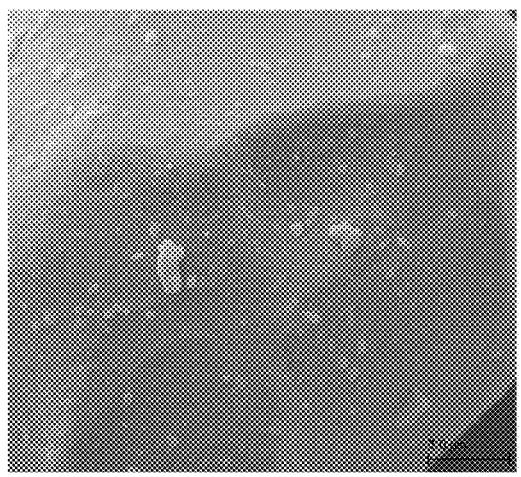

The situation is comparable for the electron micrographs shown in FIG. 8 for green-wavelength light-emitting alkaline earth metal orthosilicate luminophores. The micrographs in FIG. 8 show the characteristic particle surface of an untreated luminophore sample, that of the fluorinated material produced in accordance with the exemplary embodiments of the present invention, and that of a further sample derived from the starting material, which had additionally been coated with SiO$_2$.

Figure 9:
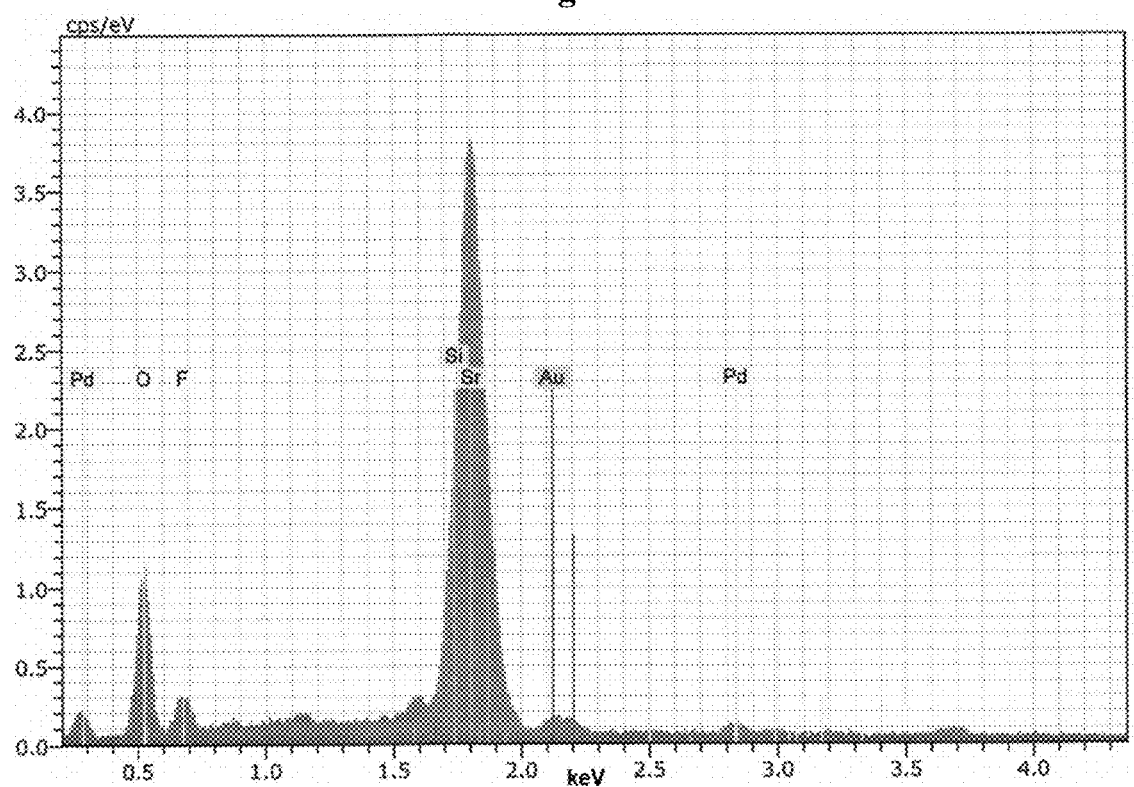
FIG. 9 is an energy-dispersive X-ray (EDX) spectroscopic image of the luminophore F-103 with manifested fluorinated surface structure according to an exemplary embodiment of the present invention.

At the same time, it becomes clear from the results of corresponding energy-dispersive X-ray spectroscopy (EDX) analyses shown in FIG. 9 that the surface structures contain fluorine. In addition to the peaks for strontium (Sr), silicon (Si) and oxygen (O), which are characteristic of the luminophore matrix, pronounced singular reflections with significant peak height are found in the EDX spectra of the luminophores fluorinated in accordance with the invention, which must be assigned unambiguously to the element fluorine (F) on the basis of the peak's energy position. In addition, the spectrum shown also contains reflections designated as gold (Au) and palladium (Pd), which result from coating the luminophore sample with gold and palladium for reasons related to analysis methodology.

Figure 10:
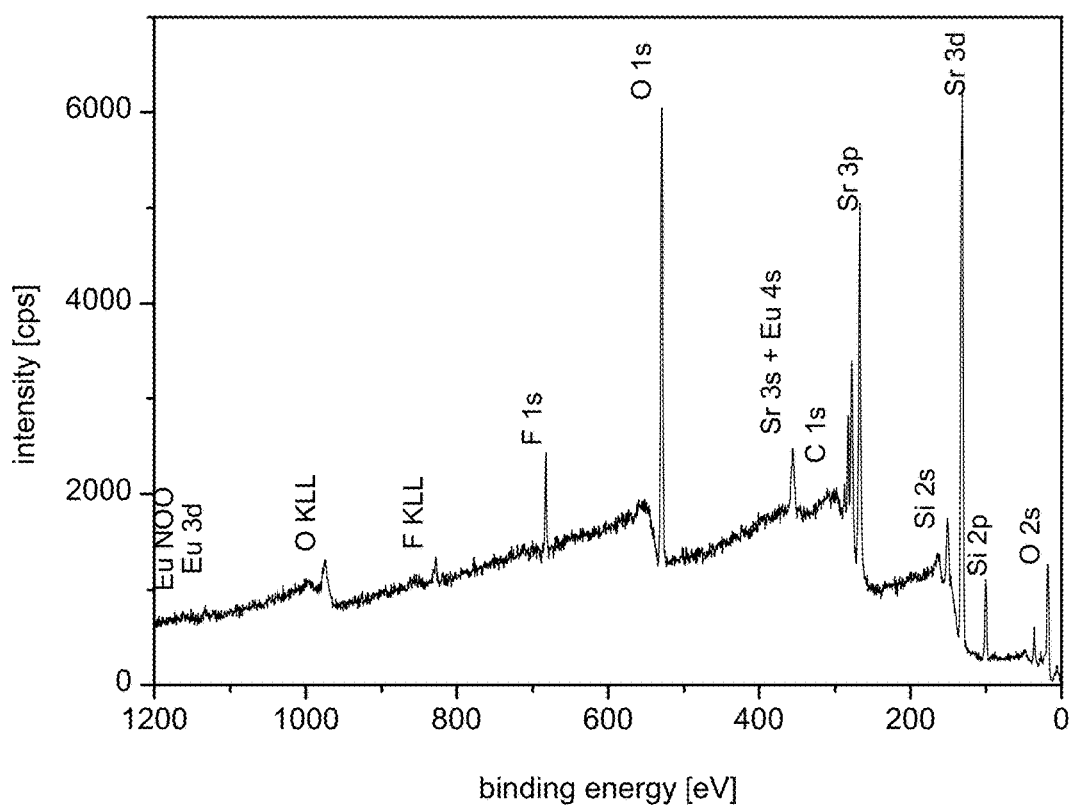
FIG. 10 is an X-ray photoelectron (XPS) spectrum of the luminophore F-103 according to an exemplary embodiment of the present invention.
Figure 11:
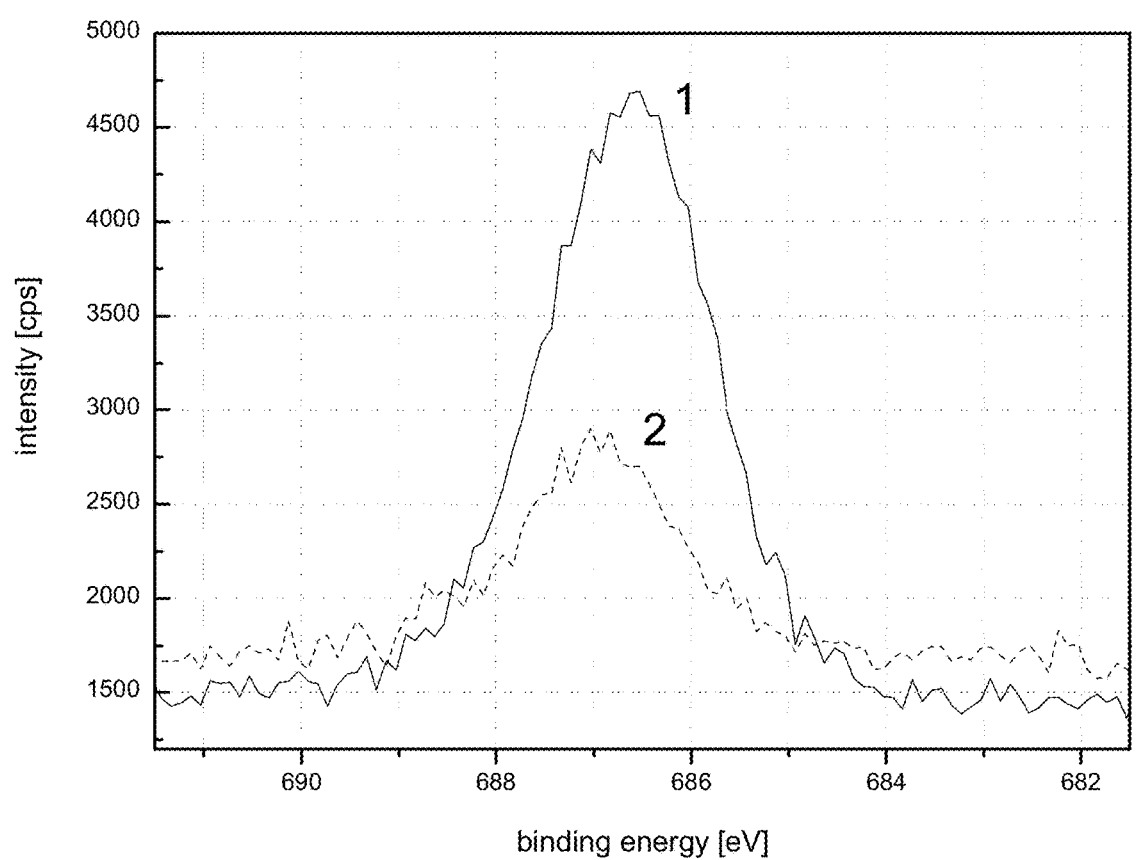
FIG. 11 is a graph showing representative fluorine XPS peaks for different luminophore samples. Curve 1 relates to the mechanical mixture of the luminophore having the composition $Sr_{2.9}Ba_{0.01}Ca_{0.05}Eu_{0.04}SiO_5$ with an amount of $NH_4F$ according to working example A1, and curve 2 relates to the fluorine is peak of the fluorinated luminophore F-103 according to an exemplary embodiment of the present invention.

Further evidence for the fixing of finely dispersed fluorides or of fluorine compounds or for the formation of networks of such compounds on the surface of the luminophores according to exemplary embodiments of the present invention is documented in FIG. 10 and FIG. 11 by the results of X-ray photoelectron spectroscopy (XPS) analyses. Fixing may include adsorption and like means for chemisorption or physisorption. The XPS spectrum, shown in FIG. 10, of a luminophore of base lattice composition $Sr_{2.9}Ba_{0.01}Ca_{0.05}Eu_{0.04}SiO_5$ treated with $NH_4F$ according to Working Example 1 shows that it is also possible with this solid-state analysis method to detect the element fluorine (F) as a constituent of the surface structures of the fluorinated luminophores. Further conclusions may also be drawn from the XPS spectrum. For example, it is evident from the comparison of the internally calibrated XPS spectra of the $NH_4F$-fluorinated oxyorthosilicate luminophore (curve 2 in FIG. 11) with that of a sample of a mechanical mixture of the corresponding luminophore matrix with an equivalent amount of $NH_4F$ (curve 1 of FIG. 11) that the F 1 s peaks determined in each case have different intensities and also exhibit a shift in binding energy relative to one another as shown in FIG. 11.

The lower intensity of the F is peak of the sample labeled as curve 2 can be interpreted as loss of some of the added fluorine from the luminophore surface during processing. The shift in the F 1 s peak to lower binding energies of curve 1 may indicate formation of a chemical bond between the applied fluorinating agent and the surface of the luminophore matrix.

In Table 1, Table 2, Table 3, Table 4, Table 5, and Table 6, several luminescence parameters of different silicatic luminophores configured in accordance with exemplary embodiments of the present invention and the results of the stability tests are compiled and compared with those of the unchanged (i.e., non-fluorinated surface) luminophore powders and in some cases with those of commercial comparative luminophores. Table 5 contains optical and stability data of fluorinated and of fluorinated and $SiO_2$-coated $Eu^{2+}$-coated strontium oxyorthosilicate luminophores. Table 6 contains optical and stability data of $SiO_2$-coated strontium oxyorthosilicate luminophores that have been fluorinated.

The moisture stability of the materials was assessed by storage of the corresponding luminophore samples in a climate-controlled cabinet, which was operated at a temperature of 85° C. and 85% air humidity, for seven days. Subsequently, the luminophores were dried at 150° C. for 24 hours and then subjected to a comparative measurement of the luminescence yield. The results of the comparative luminescence measurements demonstrate that both the luminescence efficiencies of the luminophores according to exemplary embodiments of the present invention and the temperature dependencies thereof are equal to those of commercial europium-activated alkaline earth metal oxyorthosilicate or corresponding orthosilicate luminophores, or even exceed them. Secondly, the results of the stability tests show that the luminophores according to exemplary embodiments of the present invention with fluorinated surface structure and optional additional $SiO_2$ coating, as shown in Table 4, Table 5, and Table 6, have significantly improved moisture resistances compared to unchanged (i.e. non-fluorinated surface) luminophores of the same matrix composition.

As discussed above, silicate luminophores are surface modified with a coating including a fluorinated coating. The fluorinated coating can also be applied to quantum dot luminophores. Semiconductor quantum dot luminophores convert high energy radiation into visible light, based on their band gap structure. In addition, quantum dot luminophores are very reactive due to their small size, and thus, quantum dots have also a comparatively low radiation stability and high sensitivity to water, air humidity, and other environmental factors.

Figure 12:
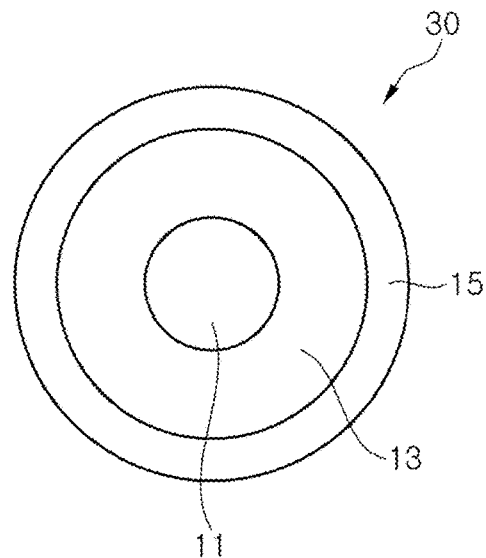
FIG. 12 depicts a sectional view of a surface modified quantum dot luminophore according to an exemplary embodiment of the present invention.
Figure 13:
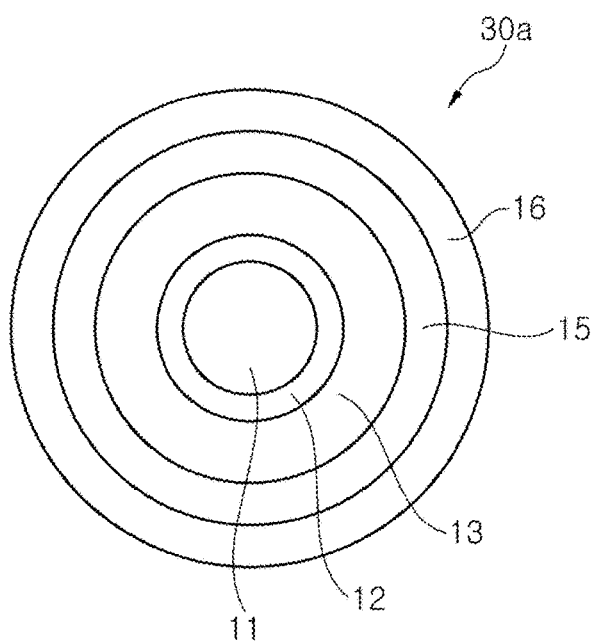
FIG. 13 depicts a sectional view of a surface modified quantum dot luminophore according to another exemplary embodiment of the present invention.

FIG. 12 and FIG. 13 depict sectional views of surface modified quantum dot (QD) luminophores 30 and 30a, according to exemplary embodiments of the present invention.

Referring to FIG. 12, the surface modified QD luminophore 30 comprises a QD luminophore 11 and a coating disposed on the surface of the QD luminophore 11. The coating may comprise a moisture barrier layer 13 and a fluorinated coating 15.

The QD luminophore 11 comprises a II-VI or III-V group compound semiconductor QD luminophore. The II-VI group compound semiconductor QD luminophore may comprise CdSe or CdS, and the III-V group compound semiconductor QD luminophore may comprise AlInGaP, AlInGaAs, or AlInGaN, but the invention is not limited thereto.

The moisture barrier layer 13 may comprise an inorganic material of MgO, $Al_2O_3$, $Y_2O_3$, $La_2O_3$, $Gd_2O_3$, $Lu_2O_3$, and $SiO_2$, the corresponding precursors, and/or at least one semiconductor material having a bandgap wider than that of the QD luminophore, and/or an organic ligand of an amine, an acid or SH. The moisture barrier layer 13 may be a single layer or multi-layers.

The inorganic materials are similar to the inorganic materials discussed in the previous embodiments, and detailed descriptions thereof are omitted. The moisture barrier layer 13 including the semiconductor material may be a shell surrounding the QD luminophore 11. The semiconductor material has a lattice mismatch with the QD luminophore 11. The larger the lattice mismatch therebetween, the higher the conversion efficiency of the surface modified luminophore 30. A buffer layer 12 may be applied between the QD luminophore 11 and the moisture barrier layer 13, as shown in FIG. 13. In the case of CdS or CdSe QD luminophores, the semiconductor material may be, for example, ZnS, and the buffer layer 12 may be ZnCdS or ZnCdSe. The moisture barrier layer 13 may also be formed to have the semiconductor material and the organic ligand of an amine, an acid or SH.

The fluorinated coating 15 is similar to the fluorinated coating described above in the previous embodiments. The fluorinated coating 15 may comprise a fluorinated inorganic agent, a fluorinated organic agent, or a combination of a fluorinated inorganic agent and a fluorinated organic agent. The fluorinated coating generates hydrophobic surface sites.

The fluorinated coating 15 may comprise a surface fixed or cross-linked fluorine, or fluorine compounds. An optional additional coating 16 including non-fluorinated layer-forming materials can be applied to the fluorinated coating 15, as shown in FIG. 13.

According to exemplary embodiments of the present invention, the QD luminophores may be fluorinated using fluorine-functionalized organosilanes having the formula $Si(OR)_3X$, where R is $CH_3$, $C_2H_5$, . . . , and X is a F-functionalized organic ligand. Controlled hydrolysis and condensation may achieve the formation of a fluorinated barrier layer on a QD luminophore matrix, which may be a barrier and may also have hydrophobic properties. In addition, the moisture barrier layer 13 may be formed on the QD luminophore 11 before forming the fluorinated barrier layer thereon.

The fluorination of the surfaces of the QD luminophores is similar to the fluorination of the surfaces of the pulverulent alkaline earth metal silicate luminophores. However, the moisture barrier layer 13 may be formed before the fluorination of the surfaces of the QD luminophores, in order to prevent surface reactions of the QD luminophores.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

TABLE 1

| Composition of the lumininophore matrix | Sample No. | Fluorinating agent | Proportion [%] | Intensity I. [%] | Color coordinates x | Color coordinates y | Half-height width [nm] | Intensity at 150° C. $I_{150}/I_{25}$ [%] | Intensity after climate-controlled chamber test $I_{before}/I_{after}$ [%] |
|---|---|---|---|---|---|---|---|---|---|
| $Sr_3SiO_5$:Eu | commercial | | | 97.6 | 0.5420 | 0.4560 | 68.8 | 91.3 | 71.7 |
| $Sr_{2.9}Ba_{0.01}Ca_{0.05}Eu_{0.04}SiO_5$ | Starting material for fluorination tests | | | 100 | 0.5462 | 0.4518 | 71.0 | 92.7 | 92.3 |
| | F-100 | $NH_4F$ | 2.5 | 99.1 | 0.5459 | 0.4522 | 70.6 | 92.4 | 93.4 |
| | F-101 | $NH_4F$ | 5 | | | | | | |
| | F-102 | $NH_4F$ | 7.5 | | | | | | |
| | F-103 | $NH_4F$ | 10 | | | | | | |
| additionally heat-treated samples (1 hour, 400° C., 35% $H_2$) | | | | | | | | | |
| | F-100T | $NH_4F$ | 2.5 | 97.3 | 0.5457 | 0.4524 | 70.7 | 92.1 | 93.1 |
| | F-101T | $NH_4F$ | 5 | 98.3 | 0.5453 | 0.4527 | 70.9 | 92.8 | 94.7 |
| | F-102T | $NH_4F$ | 7.5 | 97.2 | 0.5454 | 0.4525 | 71.1 | 92.3 | 103.7 |
| | F-103T | $NH_4F$ | 10 | 98.3 | 0.5456 | 0.4525 | 70.9 | 92.7 | 102.3 |

TABLE 2

| Composition of the lumininophore matrix | Sample No. | Fluorinating agent | Proportion [%] | Intensity I. [%] | Color coordinates x | Color coordinates y | Half-height width [nm] | Intensity at 150° C. $I_{150}/I_{25}$ [%] | Intensity after climate-controlled chamber test $I_{before}/I_{after}$ [%] |
|---|---|---|---|---|---|---|---|---|---|
| $Sr_3SiO_5$:Eu | commercial | | | 97.6 | 0.5420 | 0.4560 | 68.8 | 91.3 | 71.7 |
| $Sr_{2.9}Ba_{0.01}Ca_{0.05}Eu_{0.04}SiO_5$ | Starting material for fluorination tests | | | 100 | 0.5462 | 0.4518 | 71.0 | 92.7 | 92.3 |
| | F-200 | $NH_4HF_2$ | 2.5 | 98.8 | 0.5459 | 0.4521 | 70.6 | 93.1 | 93.4 |
| | F-201 | $NH_4HF_2$ | 5 | 99.2 | 0.5455 | 0.4525 | 70.9 | 92.6 | 94.9 |
| | F-202 | $NH_4HF_2$ | 7.5 | 99.4 | 0.5459 | 0.4521 | 70.8 | 91.9 | 98.7 |
| | F-203 | $NH_4HF_2$ | 10 | 98.8 | 0.5437 | 0.4522 | 70.9 | 92.3 | 98.9 |
| additionally heat-treated samples (1 hour, 400° C., 35% $H_2$) | | | | | | | | | |
| | F-200T | $NH_4HF_2$ | 2.5 | 97.3 | 0.5458 | 0.4523 | 70.6 | 91.7 | 103.3 |
| | F-201T | $NH_4HF_2$ | 5 | 98.3 | 0.5456 | 0.4525 | 71.1 | 92.1 | 102.6 |
| | F-202T | $NH_4HF_2$ | 7.5 | 97.2 | 0.5454 | 0.4520 | 71.1 | 92.1 | 102.7 |
| | F-203T | $NH_4HF_2$ | 10 | 98.3 | 0.5455 | 0.4576 | 70.9 | 92.5 | 102.0 |

TABLE 3

| Composition of the luminino-phore matrix | Sample No. | Fluor-inating agent | Pro-portion [%] | Intensity I. [%] | Color coordinates x | Color coordinates y | Intensity after climate-controlled chamber test $I_{before}/I_{after}$ [%] |
|---|---|---|---|---|---|---|---|
| $Sr_3SiO_5$:Eu | commercial | | | 97.6 | 0.5420 | 0.4560 | 71.7 |
| $Sr_{2.9485}Ba_{0.01}Ca_{0.0015}$ $Eu_{0.04}SiO_5$ | Starting material or fluorination tests | | | 100 | | | 83.6 |
| | F-300 | LiF | 5 | 99.1 | 0.5373 | 0.4604 | 93.3 |
| | F-301 | + | 10 | 98.5 | 0.5381 | 0.4598 | 91.9 |
| | F-310 | $BaF_2$ | 1 | 97.8 | 0.5374 | 0.4598 | 93.6 |
| | F-311 | + | 5 | 98.2 | 0.5380 | 0.4521 | 89.0 |
| | F-320 | $AlF_3$ | 5 | 98.8 | 0.5371 | 0.4606 | 99.2 |
| | F-321 | + | 10 | 98.2 | 0.5407 | 0.4572 | 94.2 |
| additionally heat-treated samples (1 hour, 400° C., 35% $H_2$) | | | | | | | |
| | F-300T | LiF | 5 | 99.0 | 0.5372 | 0.4505 | 95.1 |
| | F-310T | $BaF_2$ | 1 | 98.0 | 0.5371 | 0.4607 | 95.7 |
| | F-320T | $AlF_3$ | 5 | 99.1 | 0.5368 | 0.4608 | 99.4 |

TABLE 4

| Composition of the luminino-phore matrix | Sample No. | Flour-ination | Pro-portion [%] | Coating | Intensity I. [%] | Color coordinates x | Color coordinates y | Intensity after climate-controlled chamber test $I_{before}/I_{after}$ [%] |
|---|---|---|---|---|---|---|---|---|
| $Sr_{0.876}Ba_{1.024}$ $Eu_{0.1}SiO_4$ | Starting material for fluorination tests | | | | 100 | 0.2943 | 0.6298 | 83.6 |
| | F-400 | $NH_4F$ | 10 | — | 99.5 | 0.2938 | 0.6300 | 97.9 |
| | F-400TS | $NH_4F$ | 10 | TEOS | 99.1 | 0.2933 | 0.6294 | 98.9 |
| | F-401 | $NH_4F$ | 20 | — | 99.8 | 0.2942 | 0.6297 | 96.6 |
| | F-401TS | $NH_4F$ | 20 | TEOS | 100.7 | 0.2935 | 0.6298 | 98.7 |
| | F-402 | $NH_4FHF_2$ | 10 | — | 99.2 | 0.2938 | 0.6299 | 98.2 |
| | F-402TS | $NH_4FHF_2$ | 10 | TEOS | 100.4 | 0.2932 | 0.6302 | 99.5 |
| | F-403 | $NH_4FHF_2$ | 20 | — | 100.0 | 0.2941 | 0.6302 | 99.7 |
| | F-403TS | $NH_4FHF_2$ | 20 | TEOS | 101.4 | 0.2940 | 0.6307 | 100.1 |

TABLE 5

| Lumininophore composition | Sample No. | Flour-ination | Pro-portion [%] | Coating | Intensity I. [%] | Color coordinates x | Color coordinates y | Intensity after climate-controlled chamber test $I_{before}/I_{after}$ [%] |
|---|---|---|---|---|---|---|---|---|
| $Sr_{2.935}Ba_{0.015}$ $Eu_{0.05}SiO_5$ | | | | | 98.2 | 0.5422 | 0.4565 | 72.3 |
| | | | | | 100 | 0.5386 | 0.4592 | 78.4 |
| | F-500 | $NH_4F$ | 10 | — | 98.0 | 0.5383 | 0.4594 | 91.6 |
| | F-500TS | $NH_4F$ | 10 | TEOS | 93.9 | 0.5372 | 0.4604 | 101.1 |
| | F-501 | $NH_4F$ | 20 | — | 97.2 | 0.5382 | 0.4594 | 97.1 |
| | F-501TS | $NH_4F$ | 20 | TEOS | 93.3 | 0.5372 | 0.4605 | 101.5 |
| | F-502 | $NH_4FHF_2$ | 10 | — | 97.8 | 0.5387 | 0.4591 | 97.3 |
| | F-502TS | $NH_4FHF_2$ | 10 | TEOS | 93.2 | 0.5374 | 0.4601 | 101.8 |
| | F-503 | $NH_4FHF_2$ | 20 | — | 95.1 | 0.5383 | 0.4595 | 99.5 |
| | F-503TS | $NH_4FHF_2$ | 20 | TEOS | 93.0 | 0.5376 | 0.4699 | 100.7 |

TABLE 6

| Lumininophore composition | Sample No. | Coating | Flourination | Proportion [%] | Intensity I. [%] | Color coordinates x | y | Intensity after climate-controlled chamber test $I_{before}/I_{after}$ [%] |
|---|---|---|---|---|---|---|---|---|
| $Sr_3SiO_5:Eu$ | commercial | | | | 98.3 | 0.5319 | 0.4563 | 69.3 |
| $Sr_{2.948}Ba_{0.01}Cu_{0.002}$ | Origional | | | | 100 | 0.5462 | 0.4514 | 92.0 |
| $Eu_{0.04}SiO_5$ | TS-600 | TEOS | — | | 101.7 | 0.5465 | 0.4515 | 96.8 |
| | F-TS-600 | TEOS | $NH_4F$ | 20 | 100.6 | 0.5458 | 0.4522 | 102.7 |
| | TS-601 | TEOS | — | | 98.5 | 0.5456 | 0.4523 | 98.4 |
| | F-TS-601 | TEOS | $NH_4F$ | 20 | 97.6 | 0.5452 | 0.4528 | 103.4 |

What is claimed is:

1. A light emitting device, comprising;
a housing;
a plurality of heat-sinks adjoined to the housing and insulated from each other, a bottom surface of the heat-sinks being exposed to the outside;
a light emitting diode mounted on at least one of the heat-sinks via a conductive adhesive; and
a molding member encapsulating the light emitting diode and comprising thermosetting resin,
wherein:
a fluoride luminophore comprising I and IV group elements with fluorine and other luminophore are dispersed in the molding member;
the luminophores are configured to absorb at least a portion of light emitted from the light emitting diode and emit light having a wavelength different from that of the absorbed light; and
a fluorinated coating is formed in the luminophores, and a moisture barrier layer is formed between the luminophores and the fluorinated coating.

2. The light emitting device of claim 1, wherein the light emitting diode comprises a plurality of light emitting cells separated from each other and disposed on the same substrate.

3. The light emitting device of claim 2, wherein the light emitting cells are electrically connected to one another in series.

4. The light emitting device of claim 3, wherein the light emitting cells are electrically connected to one another in parallel.

5. The light emitting device of claim 3, wherein the light emitting device is configured to be directly driven by an AC power supply.

6. The light emitting device of claim 4, wherein the light emitting device is configured to be directly driven by an AC power supply.

7. The light emitting device of claim 1, wherein the luminophores are disposed on at least one of lateral, upper, and lower sides of the light emitting diode.

8. The light emitting device of claim 2, wherein the luminophores are dotted on the light emitting diode.

9. The light emitting device of claim 2, wherein the luminophores are uniformly distributed within the thermosetting resin of the molding member.

* * * * *